(12) United States Patent
Yoshida

(10) Patent No.: US 6,489,780 B2
(45) Date of Patent: Dec. 3, 2002

(54) ELECTRICAL CONTINUITY INSPECTION UNIT FOR CONNECTOR

(75) Inventor: Haruki Yoshida, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/756,208

(22) Filed: Jan. 9, 2001

(65) Prior Publication Data

US 2001/0007425 A1 Jul. 12, 2001

(30) Foreign Application Priority Data

Jan. 11, 2000 (JP) ........................................ 2000-002412

(51) Int. Cl.[7] ............................................... H01H 31/04
(52) U.S. Cl. ........................................ 324/538; 439/310
(58) Field of Search .............................. 324/513, 537, 324/538, 555; 439/310

(56) References Cited

U.S. PATENT DOCUMENTS 6,116,935 A * 9/2000 Fukuda ....................... 324/538

FOREIGN PATENT DOCUMENTS

| EP | 0 671 789 | 9/1995 |
| EP | 0 710 847 | 5/1996 |
| JP | 7-113836 | 5/1995 |

OTHER PUBLICATIONS

Copy of European Patent Office Communication including European Search Report for corresponding European Patent Application No. 01100327 dated May 9, 2001.

* cited by examiner

Primary Examiner—Christine K. Oda
(74) Attorney, Agent, or Firm—Armstrong, Westerman & Hattori, LLP

(57) ABSTRACT

The inspection unit has an engagement structure of a resilient locking finger and a finger deflection inspecting pin. The locking finger is provided in a terminal accommodation chamber defined in a connector housing for locking a terminal received in the terminal accommodation chamber. The finger deflection inspecting pin is provided in the inspection unit for inspecting an incomplete insertion state of the terminal. The finger deflection inspecting pin has a forward end portion formed with a concave surface. The locking finger has an extended forward end with a round head. When the extended forward end portion is received in and abuts against the concave surface, the extended forward end portion is guided by the concave surface due to the engagement structure. The concave surface may have a U-shaped section.

2 Claims, 8 Drawing Sheets

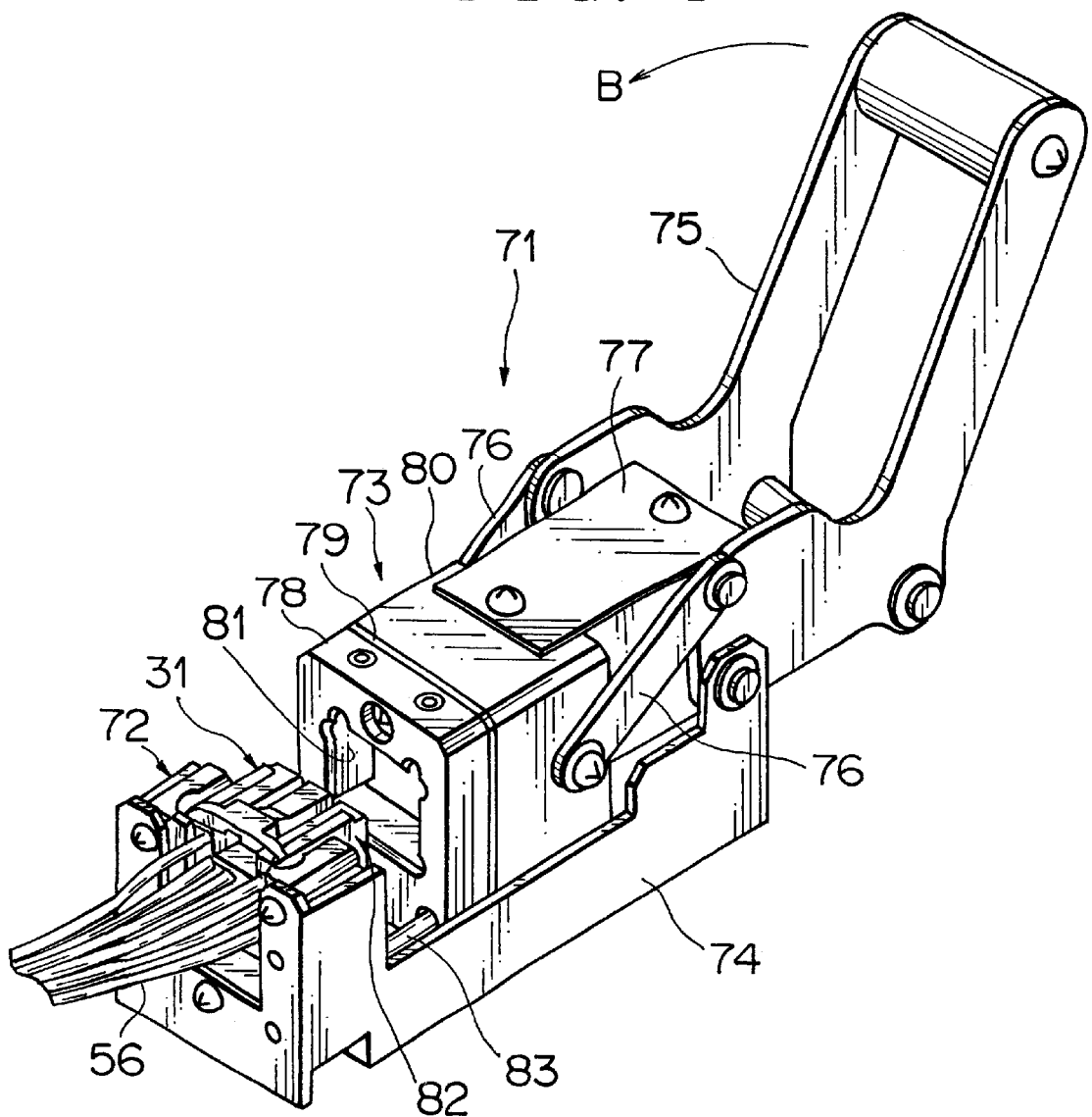
F I G. 4

ELECTRICAL CONTINUITY INSPECTION UNIT FOR CONNECTOR

FIELD OF THE INVENTION

The present invention relates to an electrical continuity inspection unit for a connector, which has an engagement structure consisting of a resilient locking finger and a finger deflection inspecting pin. The locking finger is provided in a terminal accommodation chamber defined in a connector housing for locking a terminal received in the terminal accommodation chamber. The finger deflection inspecting pin is provided in the connector continuity inspection unit for inspecting an incomplete insertion state of the terminal.

BACK GROUND OF THE INVENTION

Referring to FIG. 7 or 8, a connector continuity inspection unit 1 has a frame 2 provided with a connector holding portion 4 having a pair of guide posts for receiving a connector 3. The inspection unit 1 also has an inspection part 5 moving forward and backward relative to the connector holding portion 4. The inspection part 5 includes a hollow, rectangular extended main body 6. The extended main body 6 is provided with a plurality of continuity sensing pins 8 each contacting one of terminals 7 arranged in the connector 3. The extended main body 6 is also provided with a plurality of finger deflection inspecting pins 9 each for sensing an incomplete state of one of the terminals 7. Each continuity sensing pin 8 is formed integrally with each finger deflection inspecting pin 9.

Between each continuity sensing pin 8 and each finger deflection inspecting pin 9, there is provided an insulating sleeve 10 secured to the pin by press fit for electrically isolating the pin. The continuity sensing pin 8 is resiliently urged by a coil spring 11 toward the connector holding portion 4.

The connector holding portion 4 is fixed on the frame 2, and the extended main body 6 slides on the frame 2 through a link (not shown) by pivoting a lever 12.

In FIG. 7, the connector 3 is inserted downward into the connector holding portion 4, and the counterclockwise pivoting of the lever 12 moves the extended main body 6 toward the connector 3. Thereby, as illustrated in FIG. 8, a fore half of the connector 3 is received in the extended main body 6, so that the leading end of the continuity sensing pin 8 abuts against an end of the terminal 7. The terminal 7 is connected to an electrical wire 13 (see FIG. 7), and the continuity sensing pin 8 is connected to another electrical wire 14 (see FIG. 7). The wires are connected to a checker (not shown) so that the lightening of a lamp (not shown) of the checker indicates the electrical continuity of the terminal 7.

Meanwhile, an upper terminal 7a of FIG. 8 is incompletely inserted into a terminal accommodation chamber 16 of a connector housing 15. In this state, the connector housing 15 has a locking finger 17 which has been deflecting in a deflection space 18 of the connector housing 15, and the leading end of the finger deflection inspecting pin 9 abuts against a fore end portion of the locking finger 17 so that the continuity sensing pin 8 can not move further forward. Thereby, the terminal 7a is spaced from the continuity sensing pin 8, detecting electrical discontinuity of the terminal 7a to know incomplete insertion of the terminal 7a.

It is noted that, in the above prior art, there is a possibility of misalignment of the finger deflection inspecting pin 9 with the locking finger 17 when the leading end of the finger deflection inspecting pin 9 should abut against the fore end of the locking finger 17. That is because the finger deflection inspecting pin 9 may swing in an arrow direction P or Q and the locking finger 17 may swing in an arrow direction R or S, as illustrated in FIG. 9, during the engagement of thereof. The dynamic engagement force may further move the finger deflection inspecting pin 9 in the arrow direction P or Q. Thereby, even an incompletely inserted terminal like the terminal 7a may be wrongly determined to be in a normal state due to the electrical continuity of the terminal.

Note that the misalignment is also caused by dimensional tolerances of the positioning of the locking finger 17 and the size of the terminal 7.

SUMMARY OF THE INVENTION

In view of the above disadvantage, an object of the present invention is to provide an electrical continuity inspection unit for a connector, which has an engagement structure of a locking finger disposed in a connector and a finger deflection inspecting pin of a connector continuity inspection unit for reliably inspecting an incomplete insertion state of a terminal.

For achieving the object, an electrical continuity inspection unit for a connector has an engagement structure of a resilient locking finger and a finger deflection inspecting pin according to the present invention. The locking finger is provided in a terminal accommodation chamber defined in a connector housing for locking a terminal received in the terminal accommodation chamber. The finger deflection inspecting pin is provided in a connector continuity inspection unit for inspecting an incomplete insertion state of the terminal. The finger deflection inspecting pin has a forward end portion with a concave surface, and the locking finger has an extended forward end portion progressively smaller in section. The concave surface guides and engages with the extended forward end portion.

Preferably, the concave surface has a U-shaped section.

In the present invention described above, the leading end of the finger deflection inspecting pin surely abuts against the fore end of the locking finger, since the locking finger has been deflecting in the terminal accommodation chamber when the terminal is incompletely inserted into the terminal accommodation chamber of the connector housing. That is because the extended forward end portion of the locking finger is guided by and engages with the concave surface of the finger deflection inspecting pin.

The finger deflection inspecting pin does not disengage from the fore end of the locking finger even when the finger deflection inspecting pin tends to swing due to the dynamic abutting force between the finger deflection inspecting pin and the locking finger. That is because the extended forward end portion has been caught by the concave surface. Even with dimensional tolerances of the positioning of the locking finger and the size of the terminal, the finger deflection inspecting pin does not disengage from the fore end of the locking finger, since the extended forward end portion is caught by the concave surface.

Along the U-shaped concave surface, the extended forward end portion is easily guided. Furthermore, the U-shaped concave surface advantageously provides an elongated guide portion.

Thus, the present invention advantageously serves to reliably detect an incomplete insertion state of the terminal.

BRIEF DESCRIPTION OF THE DRAWINGS

FIG. 4 is a perspective view showing the connector continuity inspection unit in which a connector is set;

EMBODIMENTS OF THE INVENTION

Figure 1:
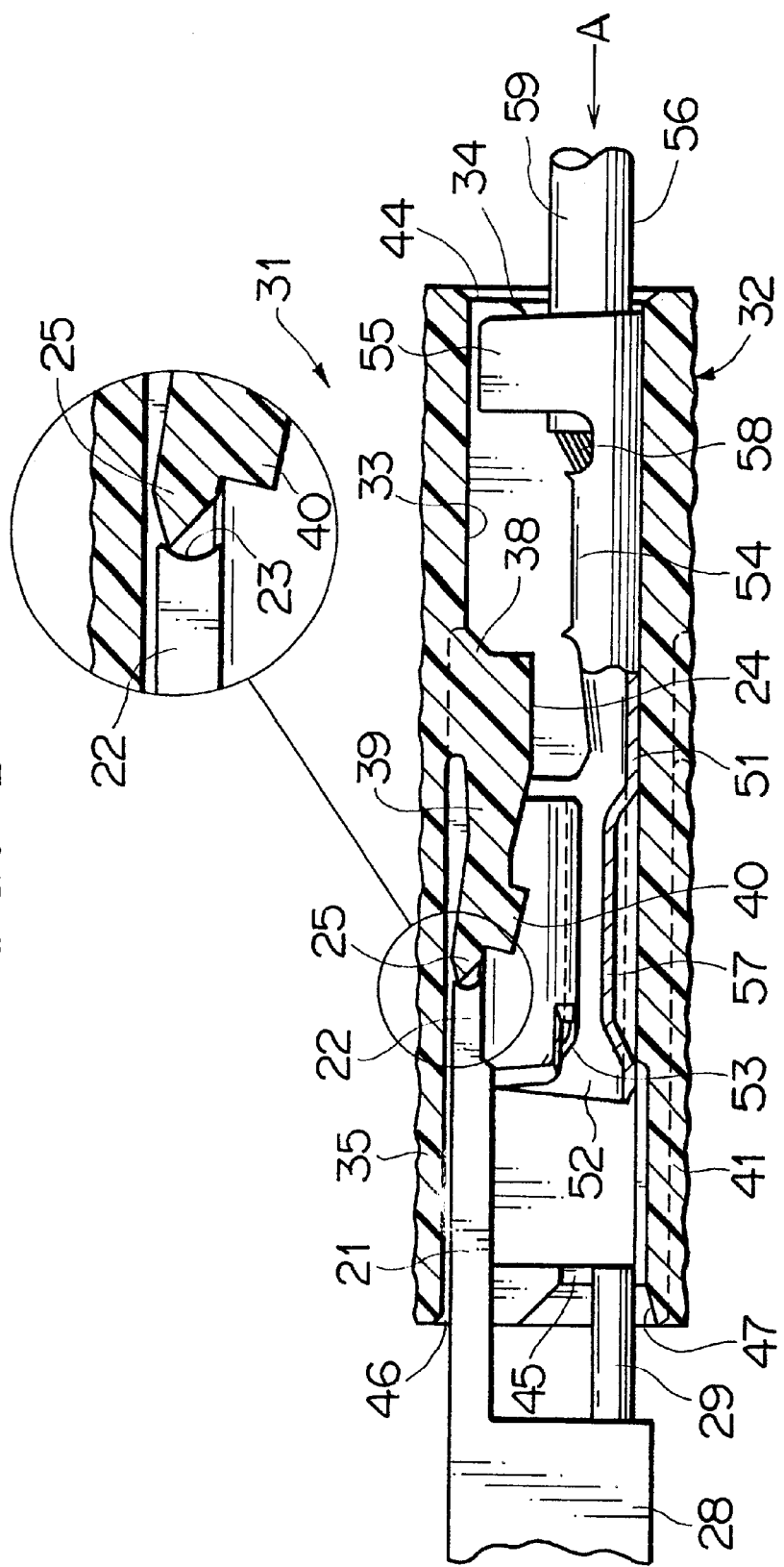
FIG. 1 is a sectional view showing an embodiment of an engagement structure according to the present invention, which includes a finger deflection inspecting pin of a connector continuity inspection unit and a locking finger of a connector, and a partial enlarged view of a primary part of the engagement structure is provided.
Figure 2:
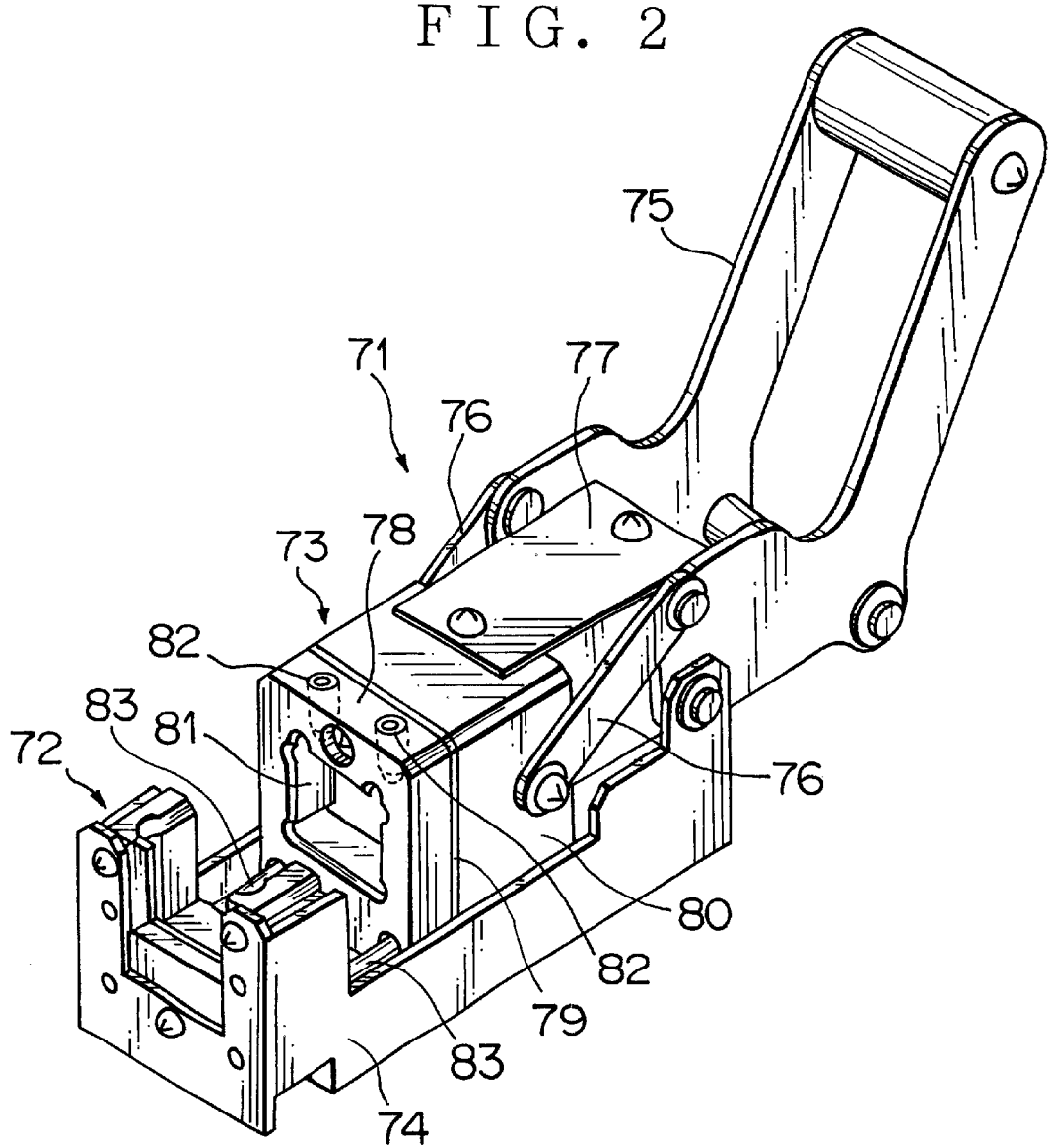
FIG. 2 is a perspective view showing the connector continuity inspection unit.

Referring to the accompanied drawings, embodiments of the present invention will be discussed. FIG. 1 is an enlarged sectional view showing primary components of an embodiment of an engagement structure according to the present invention, which includes a finger deflection inspecting pin of a connector continuity inspection unit and a locking finger of a connector. FIG. 2 is a perspective view showing the connector continuity inspection unit.

In FIG. 1, regarding the engagement structure, a finger deflection inspecting pin 21 has a forward end portion 22 formed with a concave surface 23. A locking finger 24 has an extended forward end portion 25 progressively smaller in section. The extended forward end portion 25 is received in the concave surface 23 to abut against the concave surface 23, so that the extended forward end portion 25 is guided by the concave surface 23 to engage with it.

Next, constitutional members of the engagement structure will be discussed in detail.

The finger deflection inspecting pin 21 is projecting integrally from a longitudinal end face of a substantially square column shaped extended body 28. The finger deflection inspecting pin 21 is formed in a rectangular plate shape. The forward end portion 22 of the inspecting pin 21 is formed with the concave surface 23 that is of a U-shape in a longitudinal section. The concave surface 23 is defined across the width of the finger deflection inspecting pin 21. The concave surface 23 may have a desired curvature or may be of a V-shape. The concave surface 23 having a U-shaped section easily guides the extended forward end portion 25, and, advantageously, the U-shaped section provides a guide surface longer than a general concave section.

Figure 3:
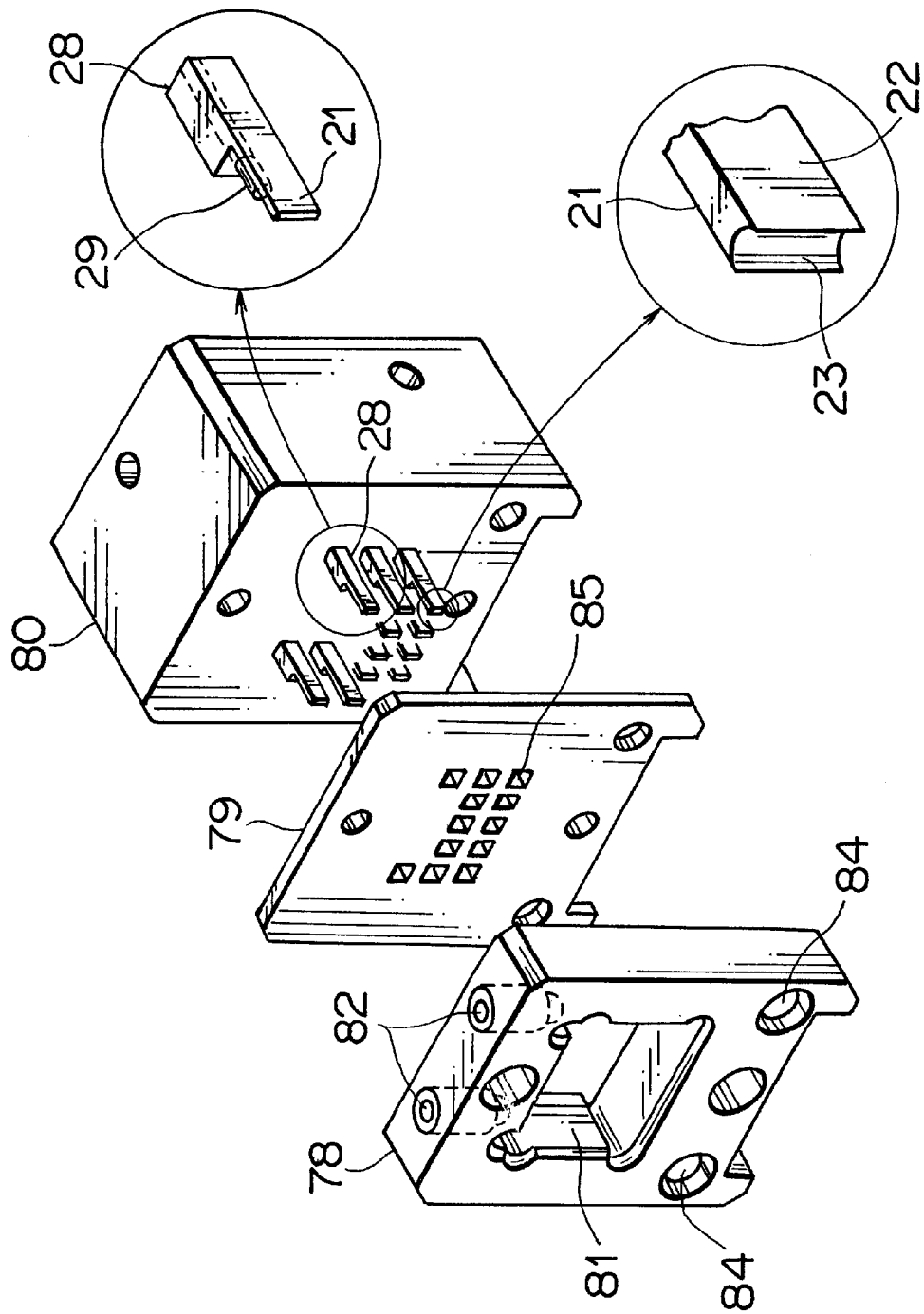
FIG. 3 is an exploded perspective view showing an inspection part of FIG. 2.
Figure 5:
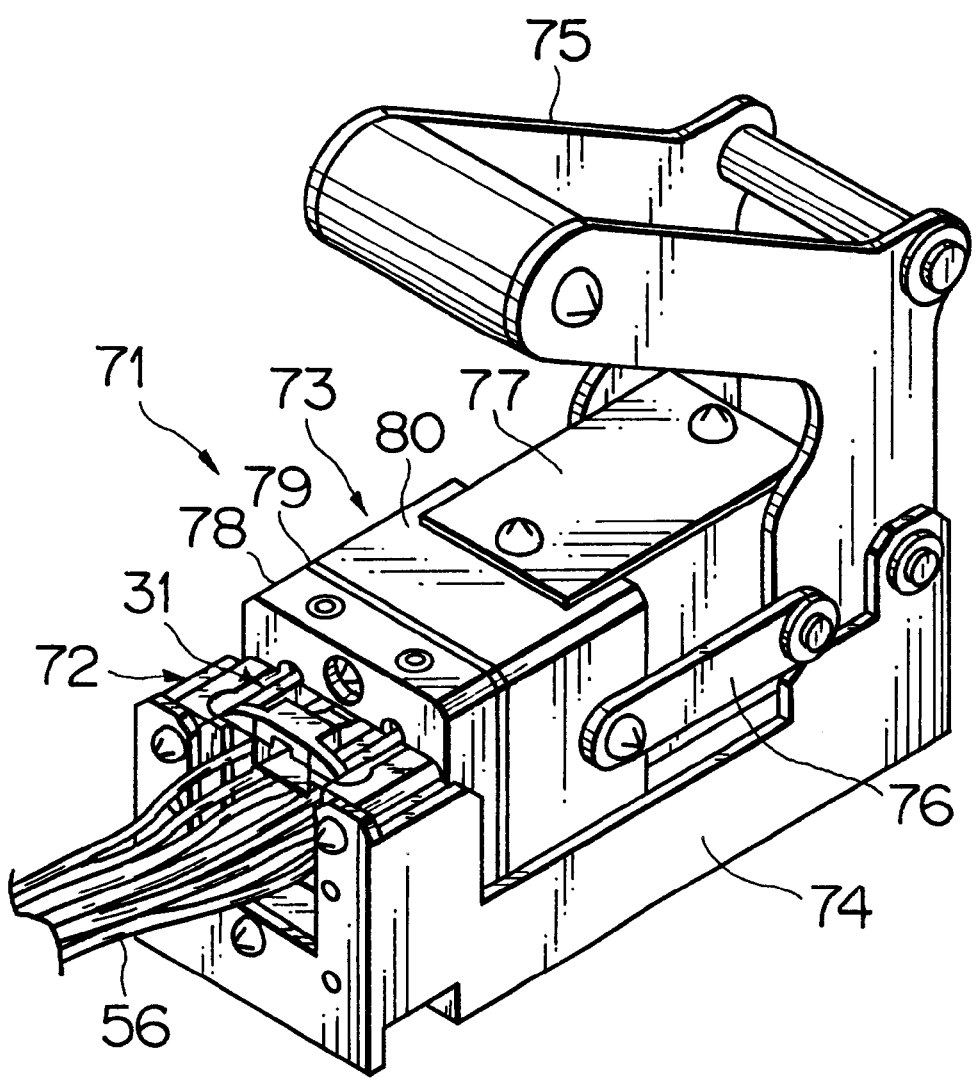
FIG. 5 is a perspective view showing the connector continuity inspection unit which is in a state for inspecting the continuity of the connector.

The extended body 28 has a circular column shaped continuity sensing pin 29 projecting from an end face thereof. As illustrated in FIG. 3, the continuity sensing pin 29 longitudinally passes through the extended body 28 and is secured to the extended body 28 via an insulating sleeve (not shown). The continuity sensing pin 29 is projecting from the end face by a length less than a half of that of the finger deflection inspecting pin. 21. The continuity sensing pin 29 is connected to an electrical wire (not shown) communicating with a checker (not shown). The contact of the continuity sensing pin 29 with a terminal 34 discussed later turns on a lamp (not shown) of the checker to indicate the electrical continuity of the terminal.

The locking finger 24 is formed in a terminal accommodation chamber 33 defined in a connector housing 32 of a connector 31. The terminal accommodation chamber 33 accommodates the terminal 34 of the connector 31.

The locking finger 24 extends longitudinally from a substantially middle portion of an upper wall 35 of the terminal accommodation chamber 33 in an insertion direction A of the terminal 34. When the terminal 34 is fully inserted into the terminal accommodation chamber 33, the locking finger 24 prevents the terminal 34 from moving opposite to the insertion direction A to maintain the terminal 34 in the terminal accommodation chamber 33.

The locking finger 24 has a root portion 38, an intermediate portion 39, a locking protrusion 40, and the extended forward end portion 25. The extended forward end portion 25 can resiliently deflect toward the upper wall 35.

The root portion 38 is joined to the upper wall 35 and is contiguous with an end of the intermediate portion 39 that is like a flat bar or a plate. The intermediate portion 39 has an opposing end positioned diagonally downward from the root portion 38 in a normal locking state (not shown) of the locking finger 24. Near the opposing end, the locking protrusion 40 is integrally formed. The locking protrusion 40 faces toward a lower wall 41 of the terminal accommodation chamber 33 to engage with the terminal 34, preventing drawing-out of the terminal 34.

The extended forward end portion 25 is contiguous with the opposing end of the intermediate portion 39 and has a shape progressively smaller in section. The extended forward end portion 25 has a tapered upper surface defining an acute angle relative to the upper wall 35 when the locking finger 24 is deflecting.

The connector housing 32 has an insertion opening 44 contiguous with the terminal accommodation chamber 33. In a side opposite to the insertion opening 44, the connector housing 32 also has a connection through hole 45 for an opposing terminal (not shown) and an insertion opening 46 for the finger deflection inspecting pin 21. The connection through hole 45 includes an insertion opening 47 for the continuity sensing pin 29.

The connector housing 32 is formed with a plurality of the terminal accommodation chambers 33 each of which accommodates the terminal 34 inserted therein.

The terminal 34 is of a receptacle type and is formed from an electrically conductive, thin metal plate through plural press-forming steps. The terminal 34 has a base plate 51 having an embossed part, a pair of resilient curled portions 52, 52 (only one is illustrated) and a pair of electrical contact pieces 53, 53 (only one is illustrated) which are provided in a forward side of the base plate 51, a pair of electrical wire crimping portions 54, 54 (only one is illustrated) positioned in a backward side of the base plate 51, and a pair of insulating layer crimping portions 55, 55 (only one is illustrated).

The terminal 34 can be electrically connected to an opposing pin terminal (not shown) in the forward side thereof (in the left side of FIG. 1) and may be electrically connected to an electrical wire 56 for an automobile wiring harness (not shown) in the backward side thereof (in the right side of FIG. 1).

The base plate 51 has a raised electrical contact 57 embossed toward the resilient curled portion 52 in the forward side thereof. The raised electrical contact 57 pinches the opposing pin terminal (not shown) together with the electrical contact pieces 53, 53.

The resilient curled portions 52, 52 each are contiguous with the base plate 51 at each side of the forward part of the base plate 51. Each resilient curled portion 52 has a width enough to define an inwardly bent portion of a round shape in section. Each resilient curled portion 52 has an outside wall almost perpendicular to the base plate 51 and an inside wall having a gentle angle relative to the base plate 51.

Each electrical contact piece 53 extends in a longitudinal direction relative to the base plate 51 and is formed by bending an end portion of the resilient curled portion 52 to define an upward small angle relative to a horizontal plane. The electrical contact piece 53 has a fore end portion upwardly curved.

The electrical wire crimping portions 54, 54 each are a plate-like short piece for crimping core wires 58 of the electrical wire 56 and are contiguous with each side edge of a backward intermediate portion of the base plate 51.

The insulation layer crimping portions 55, 55 crimp an insulation layer 59 of the electrical wire 56 and each are a plate-like piece longer than the electrical wire crimping portion 54. Each insulation layer crimping portion 55 is contiguous with each side edge of a backward end portion of the base plate 51.

Referring to operation of the above-mentioned constitution, when the terminal accommodation chamber 33 receives the terminal 34, the terminal 34 causes the locking finger 24 of the terminal accommodation chamber 33 to resiliently deflect, so that the extended forward end portion 25 moves toward the upper wall 35. A further advancement of the terminal 34 causes the locking protrusion 40 to slidingly abut against the inclined surfaces of the resilient curled portions 52, 52. Then, the locking protrusion 40 crosses over the inclined surfaces, so that the locking finger 24 resiliently returns to its original position and engages with rear ends of the resilient curled portions 52, 52 (not illustrated). Thereby, the terminal 34 is completely received in a terminal accommodation chamber 33 (not illustrated). The engagement of the terminal 34 with the locking finger 24 prevents the terminal 34 from being drawn out from the terminal accommodation chamber 33. All the terminals 34 are received in the associated terminal accommodation chambers 33 to complete the assembling of the connector 31.

Meanwhile, as illustrated in FIG. 1, when the insertion work of the terminal 34 is finished with the terminal 34 being incompletely inserted, the locking finger 24 has been deflecting to rest on the terminal 34. In this state, the finger deflection inspecting pin 21 is inserted along the upper wall 35 of the terminal accommodation chamber 33. Thereby, the concave surface 23 of the finger deflection inspecting pin 21 receives the extended forward end portion 25 of the locking finger 24. This stops a further advancement of the finger deflection inspecting pin 21 to prevent the continuity sensing pin 29 from contacting the terminal 34. The discontinuity of the continuity sensing pin 29 and the terminal 34 is detected by the checker (not shown) to know the incomplete insertion of the terminal.

Referring to more details of the above-mentioned operation, the extended forward end portion 25 of the locking finger 24 is pushed to abut against the concave surface 23 of the finger deflection inspecting pin 21, so that the extended forward end portion 25 is guided by the concave surface 23 and the extended forward end portion 25 engages with the concave surface 23. This prevents an undesirable swinging movement of the finger deflection inspecting pin 21, allowing the alignment with the leading end of the locking finger 24, even when the finger deflection inspecting pin 21 abuts against the locking finger 24 with a dynamic force at the inspection of the terminal. Furthermore, even when there is a positioning deviation of the locking finger 24 or a size variety of the terminal 34 due to dimensional tolerances thereof, an undesirable misalignment of the finger deflection inspecting pin 21 with the leading end of the locking finger 24 is also prevented. Hence, the incomplete insertion of the terminal 34 is reliably detected.

Next, a connector continuity inspection unit will be generally discussed.

Referring to FIG. 2, a connector continuity inspection unit 71 includes a connector holding portion 72, an inspection part 73, a frame 74, and a lever 75. The connector holding portion 72 has a pair of guide posts for receiving the connector 31 (see FIGS. 1 and 4). The connector holding portion 72 is fixed on a forward part of the frame 74. The frame 74 receives the inspection part 73 longitudinally slidable thereon. The lever 75 is pivotably attached to a rear part of the frame 74. The lever 75 has a pair of links 76, 76 to move the inspection part 73. Reference numeral 77 designates a cover.

The inspection part 73, as illustrated in FIG. 3, has an extended guide piece 78, a pin guide board 79, and a pin accommodation piece 80. The extended guide piece 78 has a connector engagement through hole 81 to fit with the outside shape of the connector 31 (see FIGS. 1 and 4). Furthermore, in the extended guide piece 78, there is provided a pair of ball-type plungers 82, 82. Each plunger 82 has a portion projecting into the connector engagement through hole 81. In addition, the inspection part 73 has a pair of insertion holes 84, 84 for receiving guide shafts 83, 83 (see FIGS. 2 and 4).

The pin guide board 79 is a thin rectangular plate to fit with the outer shape of the extended guide piece 78 and is formed with a plurality of guide through holes 85. The pin accommodation piece 80 is provided with a plurality of the extended pieces 28 each of which can independently project into the connector engagement through hole 81 via one of the guide through holes 85. The extended piece 28, which has been discussed above, will not be described again.

Referring to operation of the above-mentioned constitution, as illustrated in FIG. 4, the connector 31 is set on the connector holding portion 72, and pivoting the lever 75 counterclockwise (in an arrow head B direction) actuates the inspection part 73 through the links 76, 76 to move the inspection part 73 on the frame 74 toward the connector holding portion 72. Thereby, the connector engagement hole 81 receives a forward half of the connector 31, so that, by the finger deflection inspecting pin 21 (see FIGS. 1 and 3) and the continuity sensing pin 29 (see FIGS. 1 and 3), an incomplete insertion state and discontinuity of the terminal 34 (FIG. 1) is detected.

Next, a discussion will be provided for another embodiment of an engagement structure, which includes a finger deflection inspecting pin of a connector continuity inspection unit and a locking finger of a connector.

Figure 6:
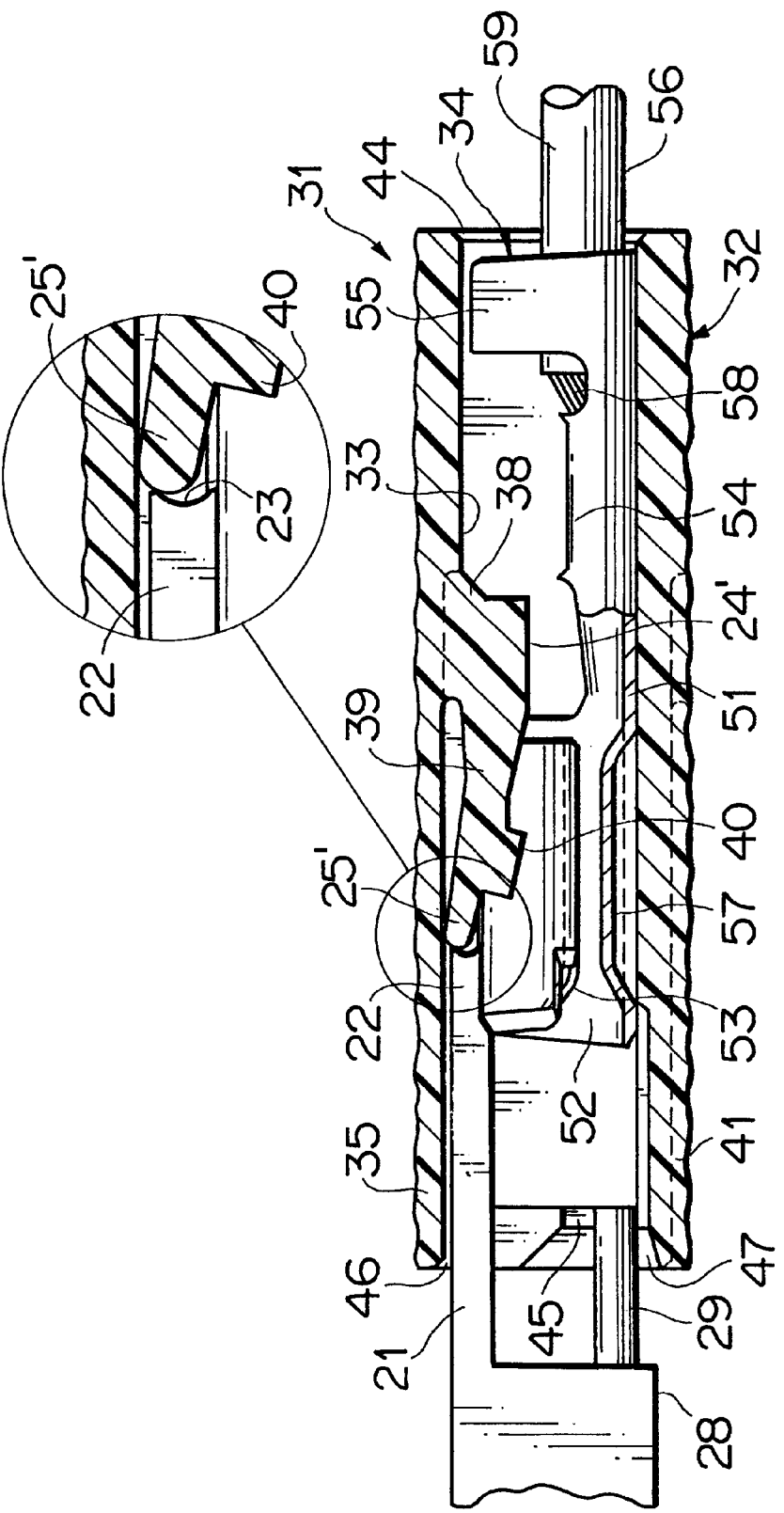
FIG. 6 is a sectional view showing another embodiment of an engagement structure according to the present invention, which includes a finger deflection inspecting pin of a connector continuity inspection unit and a locking finger of a connector, and a partial enlarged view of a primary part of the engagement structure is provided.
Figure 7:
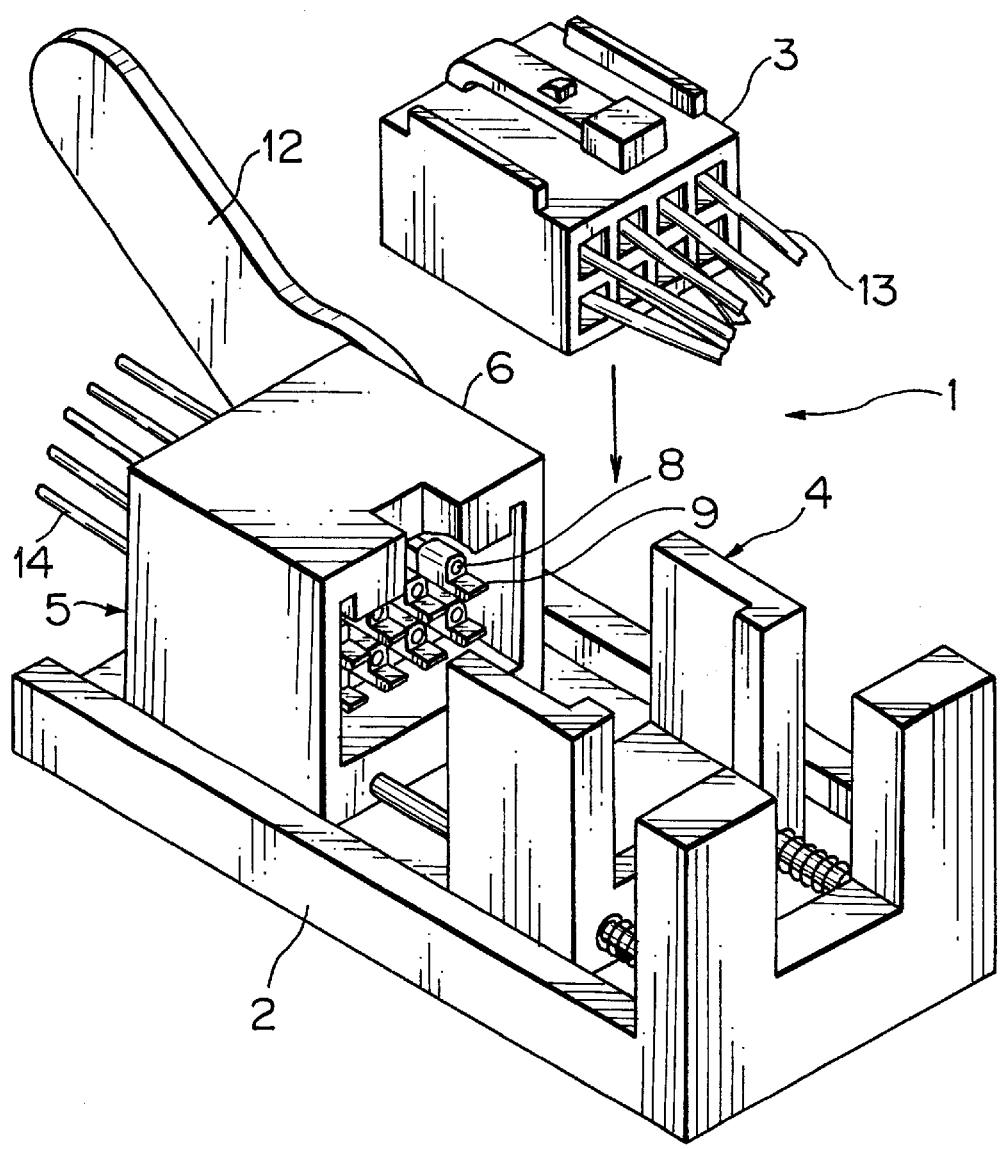
FIG. 7 is a perspective view showing a conventional connector continuity inspection unit.
Figure 8:
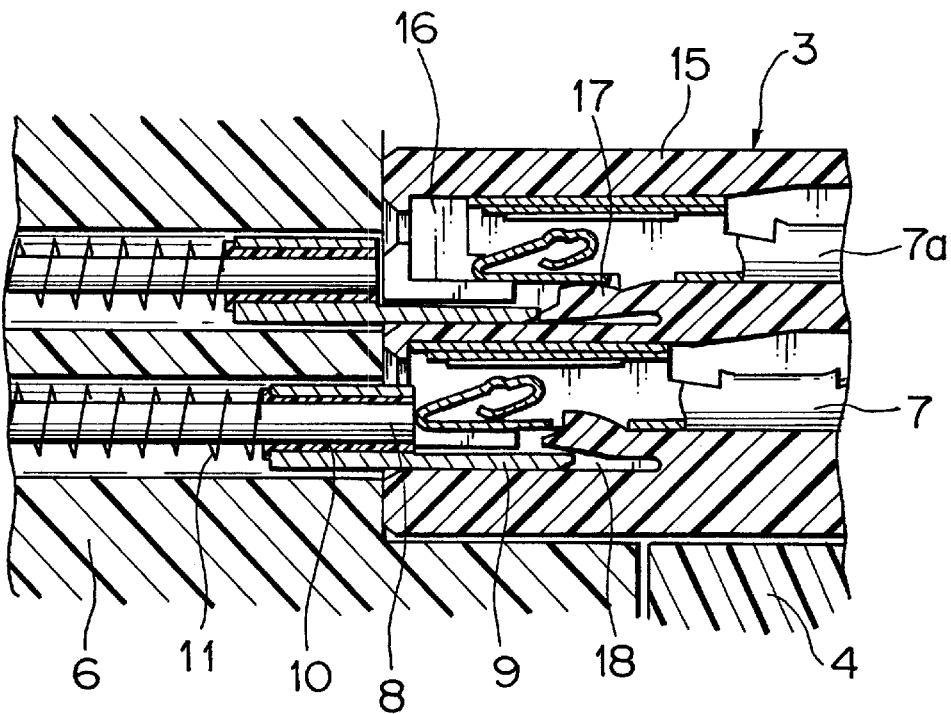
FIG. 8 is a sectional view showing the connector continuity inspection unit of FIG. 7, which is in a state for inspecting the continuity of the connector.
Figure 9:
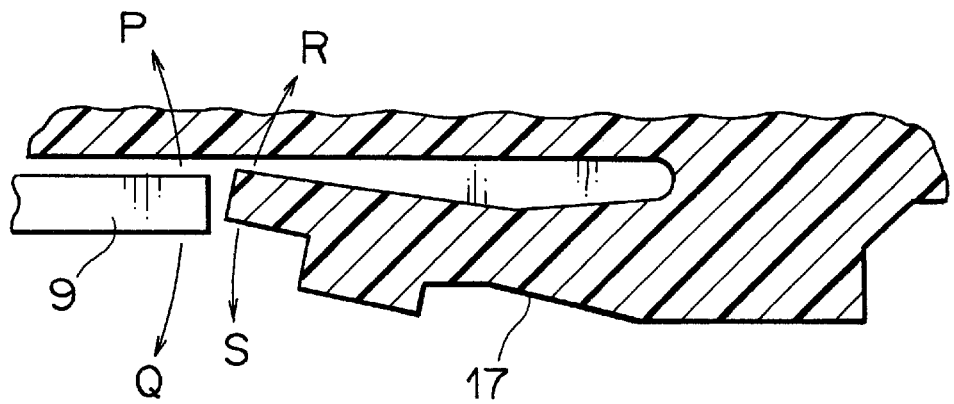
FIG. 9 is a partial enlarged view showing the finger deflection inspecting pin and the locking finger of FIG. 8.

Referring to FIG. 6, an extended forward end portion 25' of a locking finger 24' has a round head which engages with the finger deflection inspecting pin 21 in an incomplete insertion state of the terminal 34. The round head has a curvature equal to or smaller than that of the concave surface 23 of the finger deflection inspecting pin 21. The other components of this embodiment are the same as those previously described. Thus, the same reference numeral is provided to the same component which will not be discussed again, and the same operation as previously described will not be discussed again.

What is claimed is:

1. An electrical continuity inspection unit for a connector comprising an engagement structure of a resilient locking finger and a finger deflection inspecting pin, the locking finger being provided in a terminal accommodation chamber defined in a connector housing for locking a terminal received in the terminal accommodation chamber, the finger deflection inspecting pin being provided in the connector continuity inspection unit for inspecting an incomplete insertion state of the terminal, wherein the finger deflection inspecting pin has a forward end portion with a concave surface, and the concave surface guides and engages with an extended forward end portion of the locking finger, the extended forward end portion being progressively smaller in section with a round head.

2. The unit set forth in claim 1 wherein the concave surface is defined in a U-shape.

\* \* \* \* \*